United States Patent
Yeh et al.

(10) Patent No.: US 6,908,810 B2
(45) Date of Patent: Jun. 21, 2005

(54) METHOD OF PREVENTING THRESHOLD VOLTAGE OF MOS TRANSISTOR FROM BEING DECREASED BY SHALLOW TRENCH ISOLATION FORMATION

(75) Inventors: Ling-Yen Yeh, Taipei (TW); Chine-Gie Lou, Hsinchu-Hsien (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 317 days.

(21) Appl. No.: 09/924,903

(22) Filed: Aug. 8, 2001

(65) Prior Publication Data

US 2003/0032261 A1 Feb. 13, 2003

(51) Int. Cl.$^7$ .................................. H01L 21/8242
(52) U.S. Cl. .................. 438/241; 438/258; 438/374; 438/451
(58) Field of Search .................. 438/451, 174, 438/185, 289, 371, 372, 373, 374, 377, 914, 258, 241, 296

(56) References Cited

U.S. PATENT DOCUMENTS

| | | | | |
|---|---|---|---|---|
| 5,061,654 A | * | 10/1991 | Shimizu et al. | 438/451 |
| 5,571,731 A | * | 11/1996 | Gr utzediek et al. | 438/339 |
| 6,043,123 A | * | 3/2000 | Wang et al. | 438/258 |
| 6,107,126 A | * | 8/2000 | Wu | 438/217 |
| 6,228,704 B1 | * | 5/2001 | Uchida | 438/241 |
| 6,417,044 B1 | * | 7/2002 | Ono | 438/241 |
| 6,455,362 B1 | * | 9/2002 | Tran et al. | 438/194 |
| 6,461,920 B1 | * | 10/2002 | Shirahata et al. | 438/276 |

* cited by examiner

Primary Examiner—Olik Chaudhuri
Assistant Examiner—Fernando Toledo
(74) Attorney, Agent, or Firm—J.C. Patents

(57) ABSTRACT

A method of preventing decreasing threshold voltage of a MOS transistor by formation of shallow trench isolation. Shallow trenches are formed to isolate first active regions and second active regions. The first active regions are located within a core circuit region, while the second active regions are located within a peripheral circuit region. A first ion implantation to form well regions is performed on the first and second active regions, respectively. A second ion implantation is performed on the second active region and edges of the first active regions to form second channel doping regions and to increase ion concentration at the edges of the first active regions, respectively. A third ion implantation is further performed on the first active regions to form first channel doping regions.

19 Claims, 8 Drawing Sheets

METHOD OF PREVENTING THRESHOLD VOLTAGE OF MOS TRANSISTOR FROM BEING DECREASED BY SHALLOW TRENCH ISOLATION FORMATION

BACKGROUND OF THE INVENTION

1. Field of the Invention

The invention relates in general to a method of fabricating an integrated circuit (IC). More particularly, this invention relates to a method of preventing the threshold voltage of a metal-oxide semiconductor (MOS) transistor from being reduced by shallow trench isolations.

2. Description of the Related Art

A typical integrated circuit includes a peripheral circuit and a core circuit. The peripheral circuit is designed for input/output operations, while the core circuit executes major functions of the integrated circuit. By assembling the peripheral circuit and the core circuit on a single chip, the peripheral circuit is required to bear a relatively larger operation voltage. Therefore, the gate oxide layer formed in the peripheral circuit region is typically thicker than the gate oxide layer formed in the device region comprising the core circuit. For example, when a voltage of 3.3 volts is applied to a gate in the peripheral circuit region, the thickness of the gate oxide thereof is about 80 angstroms and the threshold voltage is about 0.8 volts. In contrast, when a voltage of 2.5 volts is applied to the gate with a threshold voltage of about 0.5 volt in the core circuit region, a required thickness of the gate oxide is about 55 angstroms. In addition, compared to the peripheral circuit region, the device density of the core circuit region is typically higher, which results in a smaller linewidth of gate and a smaller channel width. The threshold voltage is thus seriously decreased.

FIG. 1A is a top view of a conventional shallow trench isolation, and FIG. 1B is a cross-sectional view cutting along the line I–I' of FIG. 1B. In a silicon substrate 100, a shallow trench isolation 102 is formed in a periphery of an active region 108. A polysilicon gate 104 is formed on the substrate 100 and the shallow trench isolation 102. An electric field between the polysilicon gate 104 and the silicon substrate 100 is generated while applying a voltage to the polysilicon gate 104. The electric field is more significantly distributed near an edge 106 of the shallow trench isolation 102 under the polysilicon gate 104. As a result, a higher leakage current is generated near the edge 106 of the shallow trench isolation 102 when the transistor is off. As a result, the threshold voltage for turning on the transistor is decreased.

For MOS transistors with a gate linewidth of less than 0.25 microns, as the channel width 112 is decreased, the proportion of channel width 112 formed by the edge 106 of the active region 108 is increased. Consequently, the edge 106 affects the decrease of threshold voltage to cause a further decreased threshold voltage of the transistor.

In FIG. 2, when a channel width is 5 microns in a PMOS transistor with a gate linewidth (equivalent to channel length) of 0.18 microns, the threshold voltage is about 0.35 volts to about −0.31 volts. When the channel width is shrunk to 1 micron, the threshold voltage is further reduced to between −0.33 volts and −0.28 volts. With a further shrinkage of the channel width to 0.3 micron to 0.2 micron, the threshold voltage ranges between −0.32 volts and −0.21 volts.

In FIG. 3, when the gate linewidth of an NMOS transistor is about 0.18 micron, the threshold voltage for a channel width of 5 microns is between 0.41 volts and 0.34 volts. When the channel width is reduced to 1 micron, the threshold voltage is reduced to between 0.40 and 0.31 volts. With a further shrinkage of the channel width to between 0.3 and 0.2 microns, the threshold voltage is reduced to between 0.37 and 0.22 volts.

As shown in FIG. 2 and FIG. 3, the threshold voltage is reduced as the channel width shrinks. However, ideally, the threshold voltage is not affected by the channel width. For example, a MOS transistor with a channel width of 5 micron is expected to have a threshold voltage the same as that of the MOS transistor with a smaller channel width.

Prior technique has employed methods such as rounding oxidation, spacer protection and nitride pull back to modify the silicon substrate close to the edge of the shallow trench isolation, so as to minimize the local electric field. However, the above fabrication processes are complex and difficult to control.

SUMMARY OF THE INVENTION

The invention provides a method of preventing threshold voltage of a MOS transistor from being decreased by shallow trench isolation. The method resolves the problems of dependency of threshold voltage upon the shrinkage of channel width. In addition, the method is less complex compared to prior art, and thus is easy to control.

The method of preventing threshold voltage of a MOS transistor from being decreased by formation of shallow trench isolation comprises the following steps. Shallow trench isolations are formed in a substrate to isolate first active regions and second active regions. The first active regions are located within a core circuit region, while the second active regions are located within a peripheral circuit region. A first ion implantation is performed on the first and the second active regions, so that well regions are formed in the first and the second active regions, respectively. A second ion implantation is performed on the second active regions and edges of the first active regions. Second channel regions are thus formed in the second active regions, while ion dosage at the edges of the first active regions are increased. A third ion implantation is performed on the first active regions to form first channel regions therein.

Both the foregoing general description and the following detailed description are exemplary and explanatory only and are not restrictive of the invention, as claimed.

DESCRIPTION OF THE PREFERRED EMBODIMENTS

Figure 1A:
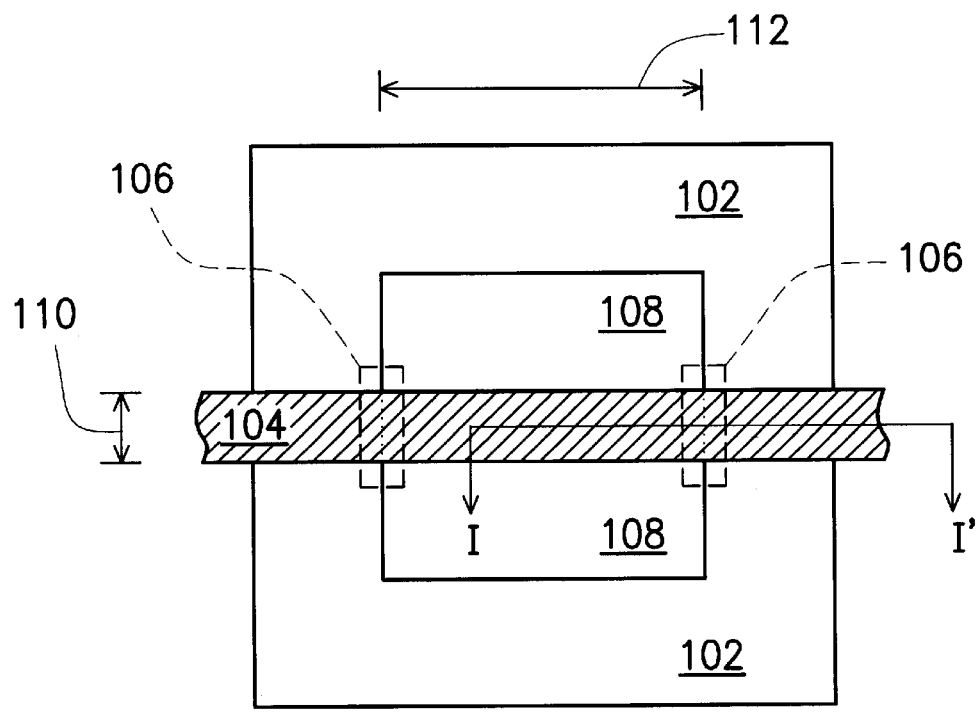
FIG. 1A illustrates a top view of a conventional shallow trench isolation.
Figure 1B:
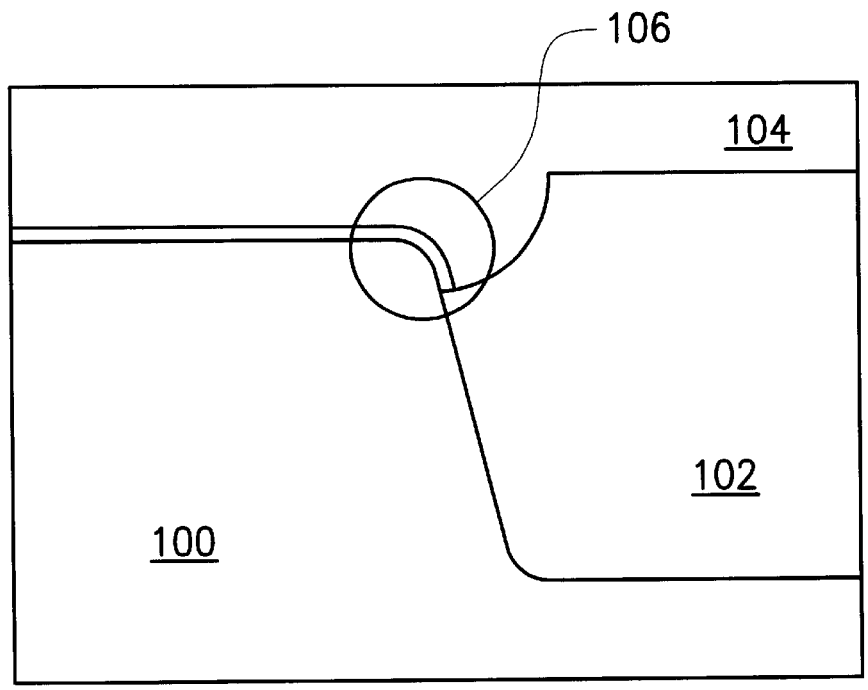
FIG. 1B is a cross-sectional view of FIG. 1A cutting along the line I–I'.
Figures 2, 3:
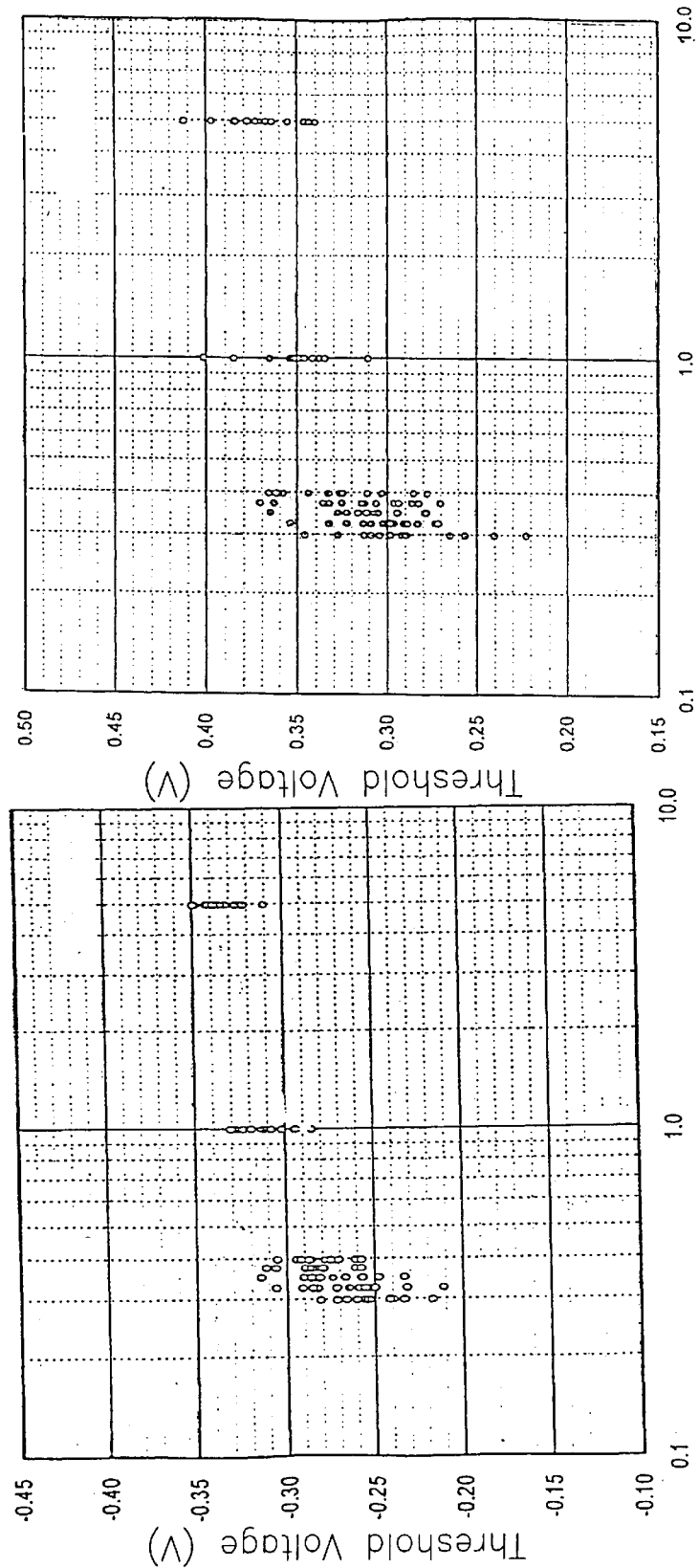
FIG. 2 shows the relationship between the threshold voltage and the channel width for a conventional PMOS transistor with a gate linewidth of 0.18 microns.
FIG. 3 shows the relationship between the threshold voltage and the channel width for a conventional NMOS transistor with a gate linewidth of 0.18 microns.
Figure 4A:
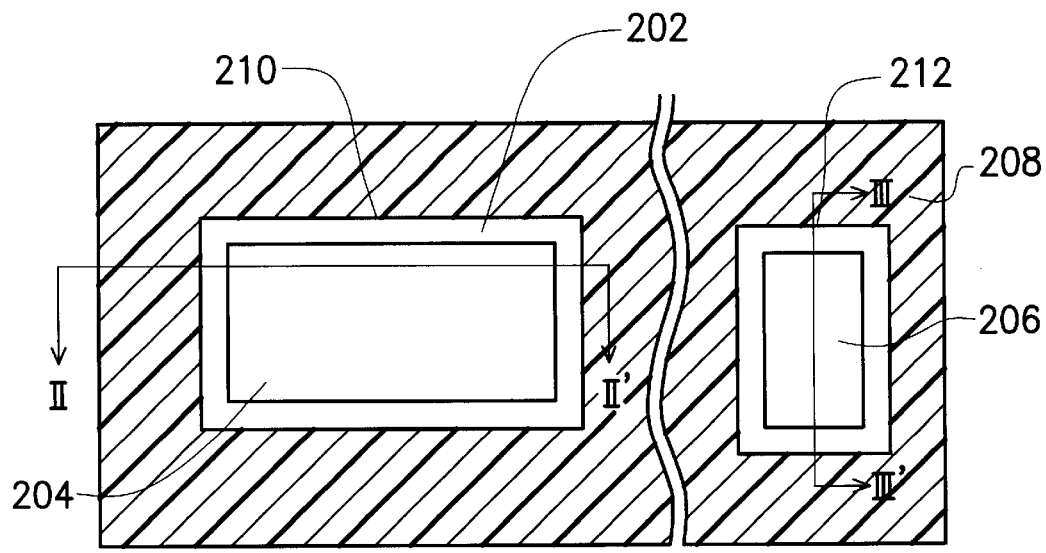
FIG. 4A is a top view showing a stage of performing a first ion implantation for method of preventing the threshold voltage of a MOS transistor from being decreased according to the invention.
Figure 4B:
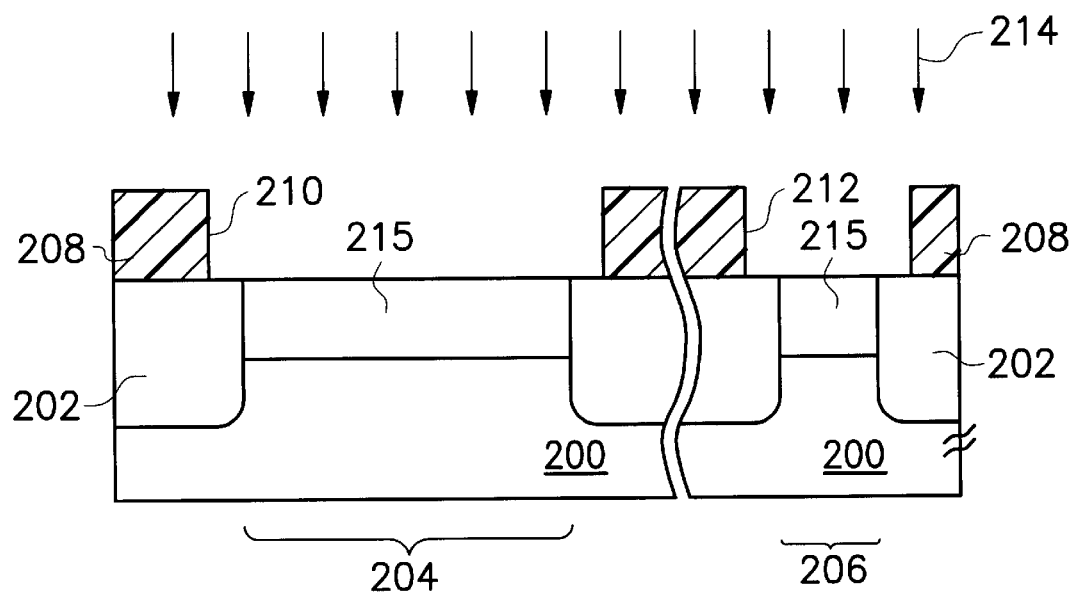
FIG. 4B with left/right views showing respectively cross-sectional views cutting along the line II–II' and the line III–III' of FIG. 4A.

Referring to FIG. 4A and FIG. 4B, a silicon substrate 200 comprises active regions 204 and 206 isolated by shallow trench isolations 202. The active region 204 is located in a peripheral circuit region, and the active region 206 is located within a core circuit region.

A patterned photoresist layer 208 is formed on the silicon substrate 200 and has a window 210 exposing the active region 204 in the peripheral circuit region as well as a window 212 exposing the active region 206 in the core circuit region. Using the photoresist layer 208 as a mask, a first ion implantation 214 is performed to dope the exposed active regions 204 and 206, so that well regions 215 are formed in both the active region 204 and the active region 206. The ions used for the first implantation 214 are first conductive type ions, so that the well regions 215 are of the first conductive type.

Figure 5A:
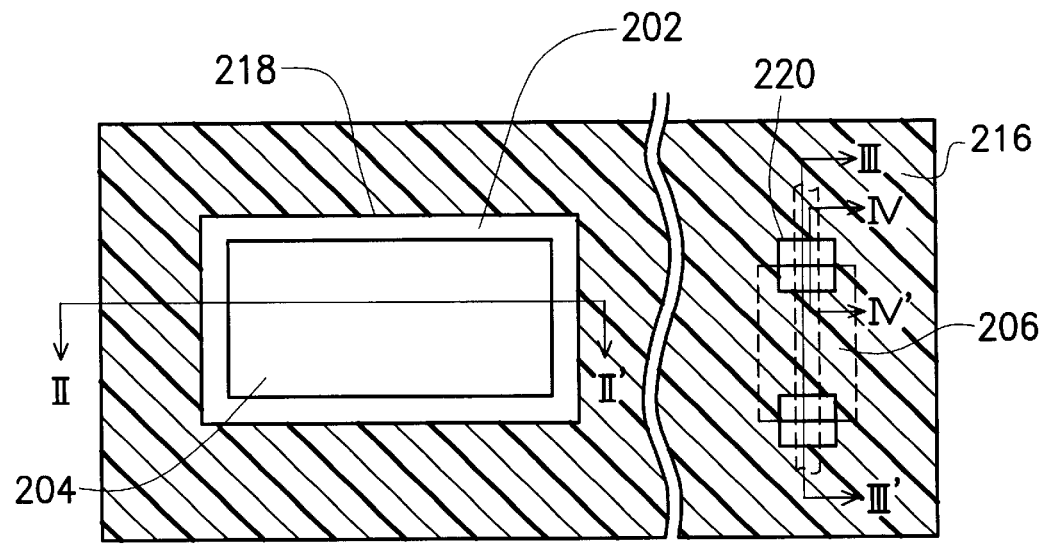
FIG. 5A is a top view showing a stage of performing a second ion implantation for method of preventing the threshold voltage of a MOS transistor from being decreased according to the invention.
Figure 5B:
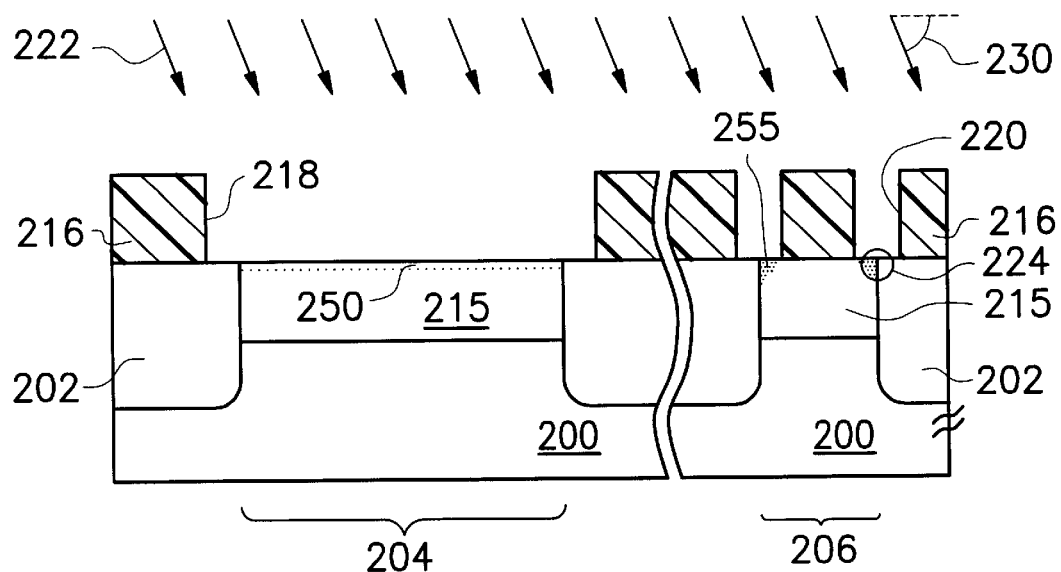
FIG. 5B with left/right views showing respectively cross-sectional views cutting along the line II–II' and the line III–III' of FIG. 5A.

Referring to both FIGS. 5A and 5B, the photoresist layer 208 is removed. A photoresist layer 216 is formed on the substrate 200. The photoresist layer 216 has a window 218 exposing the active region 204 and a window 220 exposing an edge portion of the active region 206, wherein the edge portion is the location where the subsequent formed gate will pass (shown in dotted rectangle). Using the first conductive type ions, a second ion implantation 222 is performed with the photoresist layer 216 as a mask. As a result, a channel region 250 is formed at a shallow region of the active region 204 and a shallow doped region 255 is formed in the edge portion of the active region 206. The second ion implantation is performed with a tilted angle 230, the reason for including the tilted angle in the second ion implantation step is explained later.

In this particular embodiment, according to the predetermined position for formation the gate, the upper and lower edges of the active region 206 are exposed as shown in FIG. 5A. It is appreciated that people of skill in the art may modify the pattern of the window 220 to expose, for example, the whole edge of the active region 206, according to specific requirements.

In addition to adjusting the threshold voltage of the peripheral circuit region, the second ion implantation 22 is also performed on the edge portion of the active region 206 of the core circuit region. Therefore, the implanted ion dosage at the edge portion of the active region 206 is increased. As a result, the problem such as accumulating charges due to a higher distribution density of electric field by formation of the shallow trench isolation 202 is resolved. That is, by altering the patterning of the photoresist layer 216 without introducing any additional process steps, the decrease of threshold voltage by formation of shallow trench isolation 202 is prevented. The threshold voltage of the core circuit region can thus be steadily maintained at a required magnitude.

Figure 5C:
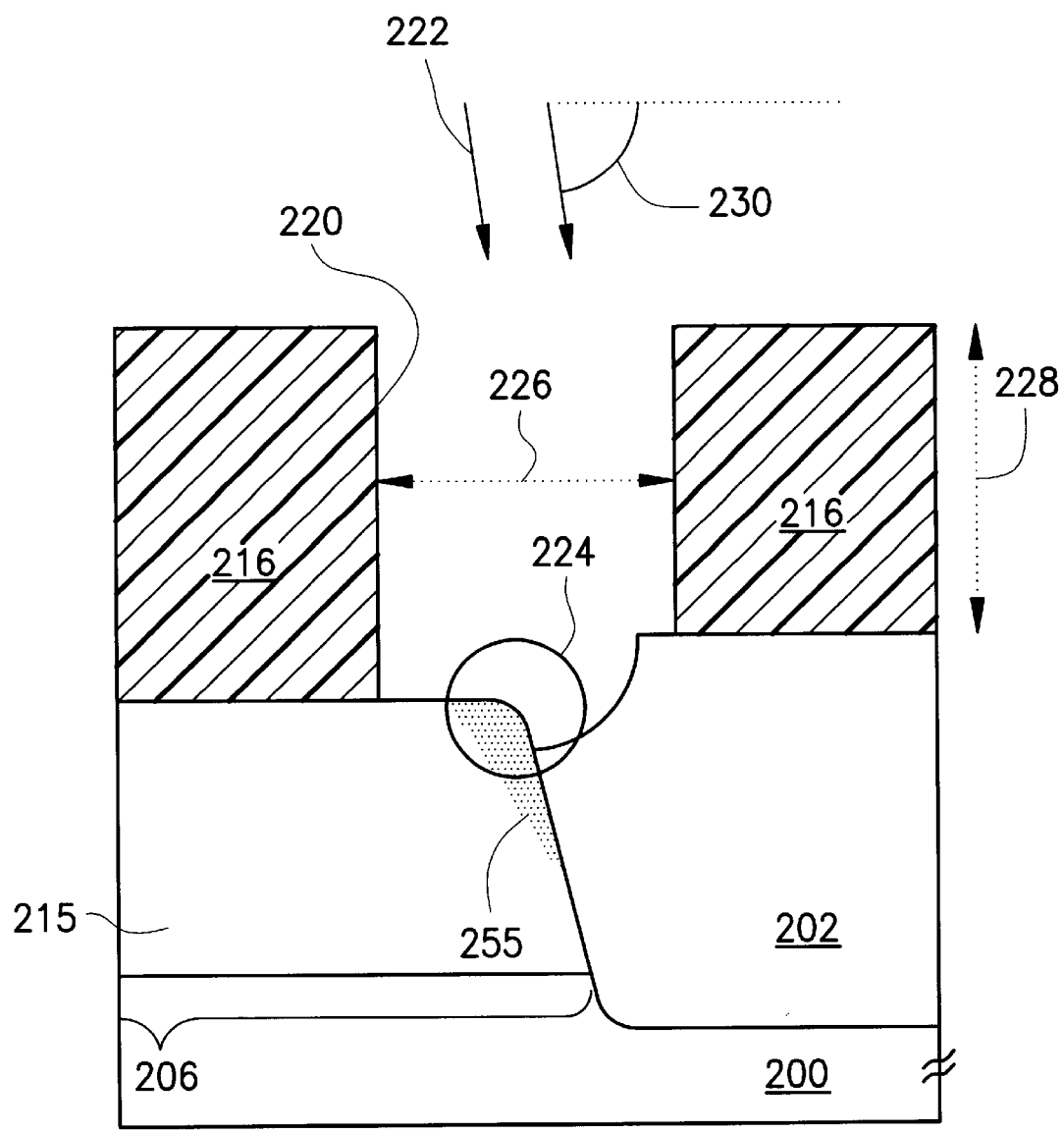
FIG. 5C shows a magnified cross-sectional view cutting along the line IV–IV' of FIG. 5A to illustrate the shadowing effect of the second photoresist layer.

As shown in FIG. 5C, the window 220 exposes the edge portion of the active region 206, including an edge of the shallow trench isolation 202 and an edge of the well region 215. The window 220 has a width denoted as 226. Preferably, the dosage of the second ion implantation 222 is different from that of the first ion implantation 214 in this specific embodiment, Although under different circumstance or consideration, the dosages may be similar or have other relationship. The objective of providing different dosages for the channel ion implant region 250 and the shallow doped region 255 is to apply a shadow effect, so as to adjust the dosage of edge portion exposed by the window 220. That is, the width 226 of the window 220, the position of the active region 206 exposed by the window 220, the thickness of the photoresist layer 216 and an implantation angle 230 of the ion implantation 222 are all factors determining the threshold voltage of the core circuit region.

Figure 6A:
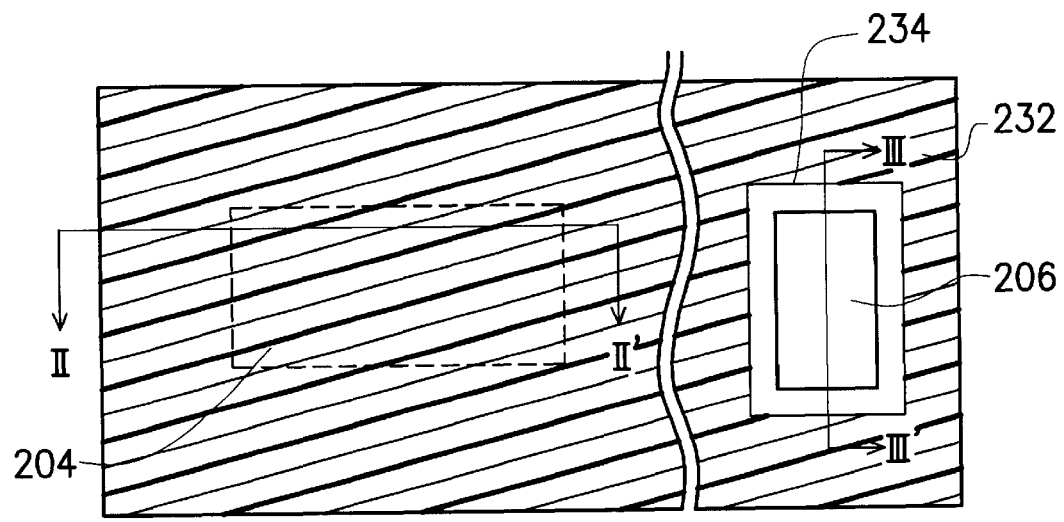
FIG. 6A is a top view showing a stage of performing a third ion implantation for the method of preventing the threshold voltage of a MOS transistor from being decreased according to the invention.
Figure 6B:
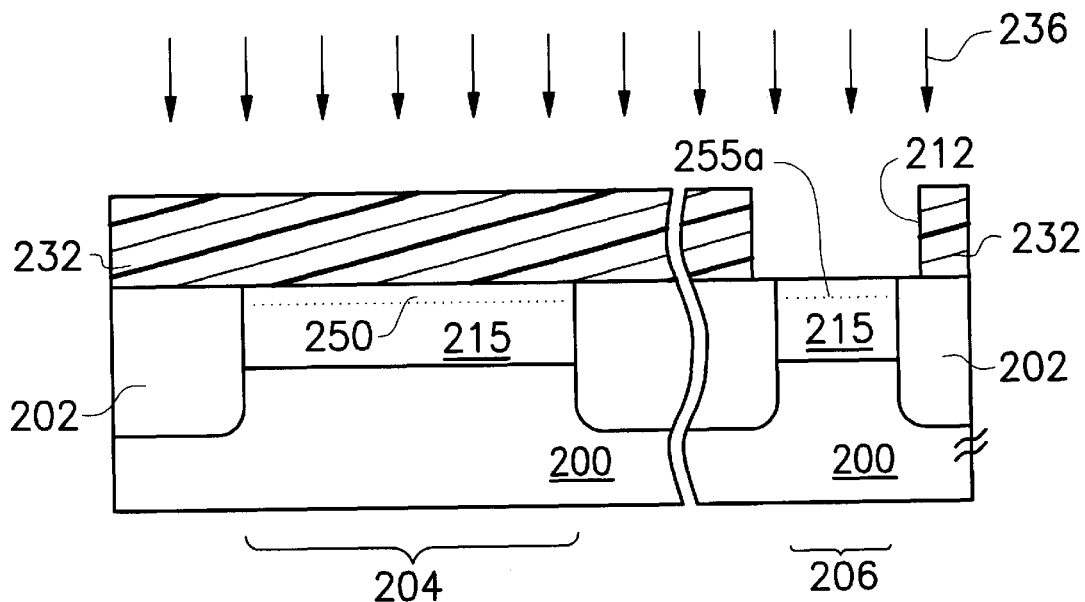
FIG. 6B with left/right views showing respectively cross-sectional views cutting along the line II–II' and the line III–III' of FIG. 6A.

In FIGS. 6A and 6B, the photoresist layer 216 is removed. A patterned photoresist layer 232 that covers the peripheral circuit region is formed on the substrate 200. The photoresist layer 232 has a window 234 to expose the active region 206 of the core circuit region. Using the photoresist layer 232 as a mask, a third ion implantation 236 is performed using the first conductive type ions 236 to form a channel region 255a. The threshold voltage of the MOS transistor in the core circuit region is thus adjusted. The photoresist layer 232 is then removed.

Figure 6C:
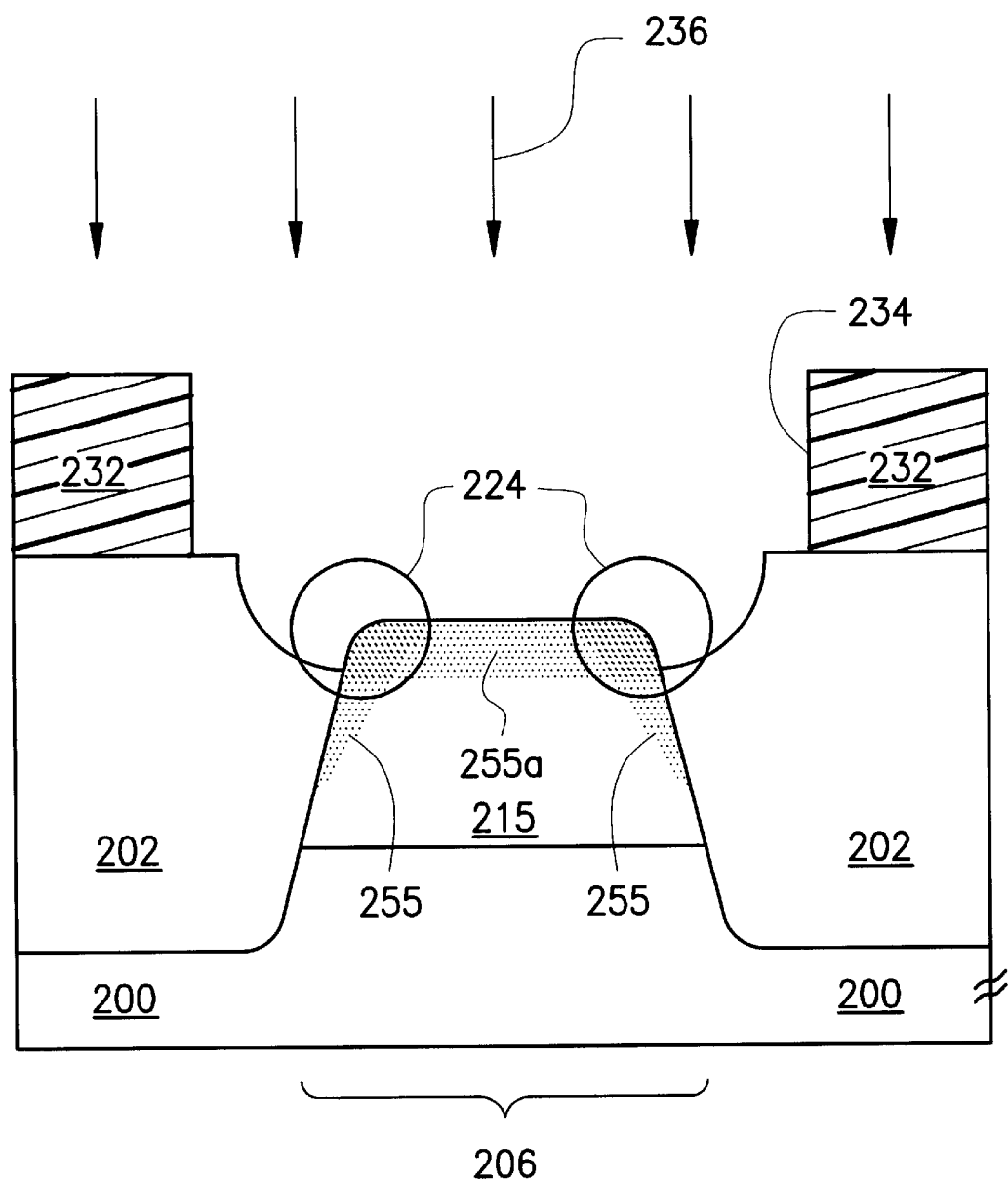
FIG. 6C shows a magnified cross-sectional view cutting along the line III–III' of FIG. 6A.

As shown in FIG. 6C, the shallow doping region 255 and the channel region 255a overlap with each other at the edge portion of the active region 206 in the device region. The edge portion 224 of the active region 206 thus comprises a higher dosage than the channel region. The threshold voltage of the MOS transistor in core circuit region is thus raised to minimize the extent of reduction due to formation of the shallow trench isolation 202.

In addition to the above process sequence, the steps as shown in FIGS. 6A to 6C can also be performed prior to the steps as shown in FIG. 5A to FIG. 5C.

As for the CMOS in the peripheral circuit region and the core circuit region, the NMOS active region and the PMOS active region have to be doped with p-type and n-type dopants respectively. If the active regions 204, 206 described above are NMOS(PMOS) active regions and the first type dopants are p type and n type, the steps as described in the above text and FIGS. 4A to 6C are repeated when the PMOS(NMOS) active regions are doped with n-type(p-type) dopants, but with p-type(n-type) dopants changing to n-type(p-type) dopants in the first, second and third ion implantation steps. In this particular embodiment, the six steps of ion implantation are performed. There is no need for providing additional processing steps when compared with the conventional method.

Figure 7A:
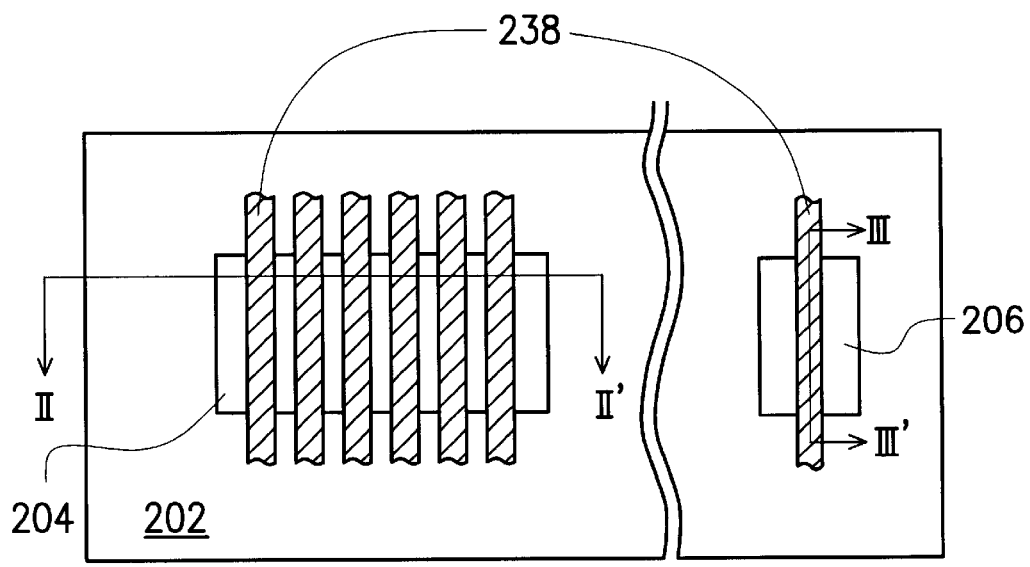
FIG. 7A is a top view showing a stage of forming a gate for the method of preventing the threshold voltage of a MOS transistor from being decreased according to the invention.
Figure 7B:
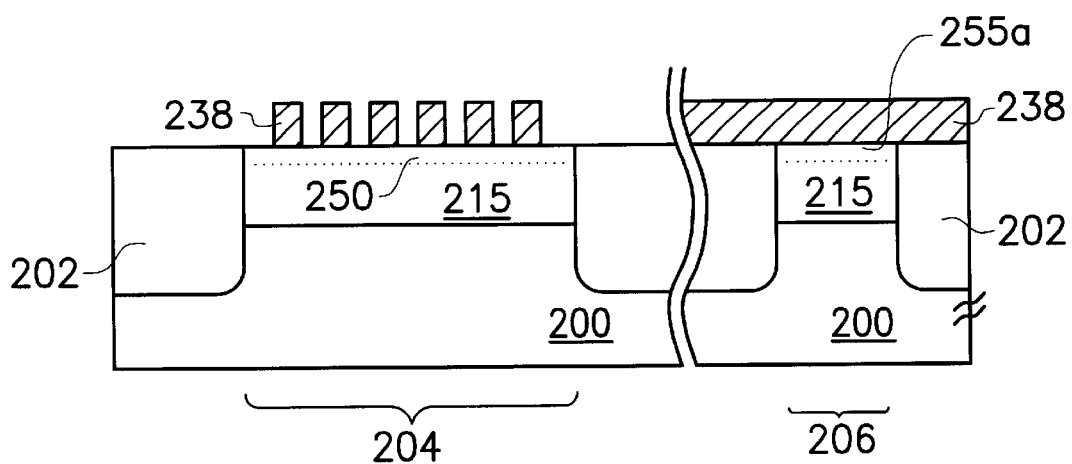
FIG. 7B with left/right views showing respectively cross-sectional views cutting along the line II–II' and the line III–III' of FIG. 7A.

Referring to both FIGS. 7A and 7B, gates 238 are formed on the active regions 204 and 206. The source/drain regions (not shown) are further formed in the substrate using the gate or an additional mask.

If the dosage for the channel regions in the active region 206, that is, the implantation dosage of the third ion implantation 234, is about $3\times10^{13}$ atoms/cm$^2$, then the dosage for the edge portions in the active region 206, that is, for the second ion implantation, is about $1\times10^{13}$ atoms/cm$^2$.

As described above, the invention uses a patterned photoresist layer with openings exposing the active region of the peripheral circuit region and the edge portion of the active region of the core circuit region. The channel region of the active region in the peripheral circuit region is formed using the same photoresist layer as that used for shadowing effect on the edge portion of the active region in the core circuit region with the assistance of adjusting implantation angle. With an additional ion implantation, the channel region in the active region of the core circuit region can then be formed.

As the invention does not increase the number of photoresist layers used for preventing the threshold voltage from being decreased, no additional fabrication process such as photolithography is required. The threshold voltage can thus be maintained as required without complicating the fabrication, so that the whole fabrication process is easier to control.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of preventing threshold voltage of a MOS transistor from being decreased by formation of shallow trench isolation, the method comprising:
   providing a substrate comprising a plurality of shallow trench isolations to isolate a plurality of first and second active regions, wherein the first active regions are located within a core circuit region, and the second active regions are located within a peripheral circuit region;
   performing a first ion implantation on the first active regions and the second active regions to form a plurality of well regions in the first and second active regions, respectively;
   performing a second ion implantation on the second active regions and edge portions of the first active regions, so that a second channel ion implant region is formed in the second active regions and a dopant concentration of the edge portions of the first active regions is increased; and
   performing a third ion implantation on the first active regions to form a first channel region in each of the first active regions.

2. The method according to claim 1, wherein the steps of performing the first, second and third ion implantations comprise steps of implanting ions with identical conductive types.

3. The method according to claim 1, wherein the step of the second ion implantation comprising using ions with a dosage of about 1E13 atoms/cm$^2$.

4. The method according to claim 1, wherein the step of the third ion implantation comprises using ions with a dosage of about 3E13 atoms/cm$^2$.

5. The method according to claim 1, wherein the step of performing the second ion implantation further comprises:
   forming a patterned photoresist layer having a plurality of first windows exposing edge portions of the first active regions and a plurality of second windows exposing the second active regions; and
   using the photoresist layer a mask to perform the second ion implantation.

6. The method according to claim 5, wherein the dosage implanted into the edge portions of the first active regions can be adjusted by controlling a thickness of the photoresist layer.

7. The method according to claim 5, wherein the dosage implanted into the edge portions of the first active regions can be adjusted by controlling a width of the first windows and relative positions between the first windows and the edge portions of the first active regions.

8. The method according to claim 5, wherein the dosage implanted into the edge portions of the first active regions can be adjusted by controlling an implantation angle thereof.

9. A method of preventing a threshold voltage of a MOS transistor from being decreased by formation of shallow trench isolation, the method comprising:
   providing a substrate comprising a plurality of shallow trench isolations to isolate a plurality of active regions;
   performing a first ion implantation on the active regions to form a channel region in each active region; and
   performing a second ion implantation on edge portions of the active regions to adjust a dosage of implanted ions thereof.

10. The method according to claim 9, wherein the first ion implantation and the second ion implantation are performed using identical conductive ion types.

11. The method according to claim 10, wherein the step of performing the first ion implantation comprises using ions with a dosage of about 3E13 atoms/cm$^2$.

12. The method according to claim 10, wherein the step of performing the second ion implantation comprises using ions with a dosage of about 1E13 atoms/cm$^2$.

13. A method of preventing a threshold voltage of a MOS transistor from being decreased by formation of shallow trench isolation, the method comprising:
   providing a substrate comprising a plurality of shallow trench isolations to isolate a plurality of first active regions and a plurality of second active regions, wherein the first active regions are located within a core circuit region, and the second active regions are located within a peripheral circuit region;
   performing a first ion implantation on the first active regions and the second active regions to form well regions in both the first and the second active regions;
   forming a patterned photoresist layer comprising a plurality of first windows exposing edge portions of the first active regions and a plurality of second windows exposing edge portions of the second active regions;
   performing a second ion implantation while using the patterned photoresist layer as a mask to form a second channel region in the second active regions and to increase doping concentration in the edge portions of the first active regions; and
   performing a third ion implantation on the first active regions to form a first channel region.

14. The method according to claim 13, wherein the steps of performing the first, second and third ion implantations comprise steps of implanting ions with identical conductive types.

15. The method according to claim 13, wherein the step of the second ion implantation comprises using ions with a dosage of about 1E13 atoms/cm$^2$.

16. The method according to claim 13, wherein the step of the third ion implantation comprises using ions with a dosage of about 3E13 atoms/cm$^2$.

17. The method according to claim 13, wherein the dosage implanted into the edge portions of the first active regions can be adjusted by controlling a thickness of the photoresist layer.

18. The method according to claim 13, wherein the dosage implanted into the edge portions of the first active regions can be adjusted by controlling a width of the first windows and relative positions between the first windows and the edge portions of the first active regions.

19. The method according to claim 13, wherein the dosage implanted into the edge portions of the first active regions can be adjusted by controlling an implantation angle thereof.

* * * * *